(12) United States Patent
Lee (10) Patent No.: US 8,659,049 B2
(45) Date of Patent: Feb. 25, 2014

(54) LIGHT EMITTING DIODE PACKAGING STRUCTURE

(75) Inventor: Kechin Lee, Zhongshan (CN)

(73) Assignee: Zhongshan Weiqiang Technology Co., Ltd., Zhongshan, Guangdong (CN)

( * ) Notice: Subject to any disclaimer, the term of this patent is extended or adjusted under 35 U.S.C. 154(b) by 0 days.

(21) Appl. No.: 13/495,254

(22) Filed: Jun. 13, 2012

(65) Prior Publication Data

US 2012/0248487 A1 Oct. 4, 2012

Related U.S. Application Data

(63) Continuation of application No. PCT/CN2010/070629, filed on Feb. 11, 2010.

(30) Foreign Application Priority Data

Jan. 1, 2010 (CN) .......................... 2010 1 0019245

(51) Int. Cl.
*H01L 33/64* (2010.01)

(52) U.S. Cl.
USPC ........................................................ 257/99

(58) Field of Classification Search
USPC .............. 257/98, 99, E33.056, E33.057, 675, 257/712, 718, 719, 721, 722, E33.075
See application file for complete search history.

(56) References Cited

U.S. PATENT DOCUMENTS

| | | | |
|---|---|---|---|
| 3,946,416 A * | 3/1976 | Hacskaylo ........................ 372/36 |
| 4,394,679 A * | 7/1983 | Hawrylo ............................ 257/99 |
| 4,712,163 A * | 12/1987 | Oxley ................................ 362/29 |
| 6,517,218 B2 * | 2/2003 | Hochstein ....................... 362/294 |
| 7,549,773 B2 * | 6/2009 | Lim ................................. 362/294 |
| 8,294,262 B2 * | 10/2012 | Lee .................................. 257/719 |
| 2005/0194607 A1 * | 9/2005 | Barnett et al. ..................... 257/99 |
| 2008/0099775 A1 * | 5/2008 | Yu et al. ............................ 257/98 |
| 2008/0142822 A1 * | 6/2008 | Kim et al. .......................... 257/98 |

(Continued)

FOREIGN PATENT DOCUMENTS

| CN | 101222006 | 7/2008 |
|---|---|---|
| CN | 101315927 | 12/2008 |

(Continued)

OTHER PUBLICATIONS

International Search Report (with English translation) for corresponding International Application No. PCT/CN2010/070629, mailed Oct. 21, 2010.

*Primary Examiner* — Michele Fan
(74) *Attorney, Agent, or Firm* — Myers Wolin, LLC (57) ABSTRACT

The present invention discloses an LED packaging structure, which comprises a metal housing having a cavity and two open ends, a sintered two-phase-flow heat transfer device having a flat top mounting plane, a lens disposed in the first open end, at least one LED chip mounted in the cavity of the metal housing and on the mounting plane of the two-phase-flow heat transfer device; the LED chip is connected with an electrical connection device, and wherein the sintered two-phase-flow, electrical connection device and LED chip are fixed together through a fixing base. Using a sintered two-phase-flow heat transfer device for heat dissipation, the heat generated by the LED could be expelled in time for dealing with long-term continual work, and thus the LED chip could have a longer service life. In addition, the lens used in the present invention could improve the luminescent efficiency.

2 Claims, 6 Drawing Sheets

(56) References Cited

U.S. PATENT DOCUMENTS

2008/0283857 A1* 11/2008 Chen et al. ................ 257/98
2009/0225540 A1    9/2009 Chen
2010/0123164 A1*  5/2010 Suehiro et al. ............ 257/99
2010/0181593 A1*  7/2010 Lee ............................ 257/99

FOREIGN PATENT DOCUMENTS

| CN | 100468795 | | 3/2009 |
| JP | 2007-173874 | | 7/2007 |
| TW | 362513 | U * | 8/2009 |

* cited by examiner

Fig.11

LIGHT EMITTING DIODE PACKAGING STRUCTURE

CROSS REFERENCE TO RELATED APPLICATIONS

The present application is a continuation of PCT/CN2010/070629, filed on Feb. 11, 2010, which claims priority to Chinese Patent Application No. 201010019245.0, filed Jan. 1, 2010, the contents of each of which are incorporated herein by reference.

TECHNICAL FIELD

The present invention relates to a semiconductor packaging structure, and more particularly to an LED packaging structure.

BACKGROUND INFORMATION

It is well known that as LEDs possess the characteristics of energy saving and high integration level, they have been widely used in a variety of lighting areas. However, LEDs are also characterized in high heat generation, as the rapid development of the technology, the power and density of LEDs are growing as well in order to satisfy the requirements of high brightness lighting, this creates a high heat accumulation problem, if the heat generated by LEDs at work could not be effectively discharged in time, the heat accumulated would significantly impact the luminescent performance of the LEDs, thus the industry has relatively strict standards in heat dissipation for LED packaging. In a known LED packaging structure, LED or LEDs are mounted on a print circuit board, and the heat generated by LEDs at work is conducted to the heat sink through the print circuit board and dissipated thereon, but this structure has not fully met the requirements of heat dissipation for LEDs, and thus the service life of the LEDs may be shortened.

In addition, in nature LED is a point light source, and has a drawback of uneven brightness, there is thus a need for the industry to improve the performance of LEDs in ways of light focusing and illuminant efficiency.

SUMMARY OF THE INVENTION

In order to solve the above problems, the present invention aims at providing an LED packaging structure, which can expel the heat generated from the LED chip quickly and effectively, improve the luminescent efficiency effectively and guarantee its service life.

The technical solution adopted by the present invention to solve the technical problem is as: an LED packaging structure, comprising a metal housing having a cavity and two open ends; a sintered two-phase-flow heat transfer device having a flat top mounting plane, connected to the second open end of the metal housing; a lens disposed in the first open end of the metal housing; at least one LED chip, of which wavelength is between 310 to 470 nm disposed in the cavity of the metal housing and directly mounted on the mounting plane of the two-phase-flow heat transfer device; an electrical connection device connecting the LED chip with external power source, a fixing base fixing the two-phase-flow heat transfer device, electrical connection device and LED chip together.

The LED chip used in the present invention may be an ultra violet LED, purple LED, or blue LED.

The LED chip mounted on the metal housing may be one or more.

The lens may be coated by phosphor, which is excited by the ultraviolet LED, purple LED, or Blue LED to generate the mixed light, to gain the color temperatures required.

The lens may be a Fresnel lens consisting of a plurality of homocentric structures.

The two-phase-flow heat transfer device may be a heat pipe, of which flat top is used as the mounting plane for mounting the LED chip, and the heat pipe is provided with a spiral groove for mounting an extra heat pipe. The extra heat pipe is provided with grooves and copper powder sintering portion attached on the inner wall thereof, the diameters of the majority of the copper powders of the copper powder sintering portion are greater than the width of the grooves.

The sintered two-phase-flow heat transfer device may be a heat column, of which upper surface is used as the mounting plane for mounting the LED chip, wherein the two-phase-flow heat transfer device has at least one cooling fin located on the side thereof away from the mounting plane.

The sintered two-phase-flow heat transfer device may be a bended or flattened heat pipe, and the mounting plane is located in the middle of the heat pipe, wherein the sintered two-phase-flow heat transfer device has at least one cooling fin on each side thereof.

The sintered two-phase-flow heat transfer device may be a vapor chamber having at least one projecting plane, which is used as the mounting plane for mounting the LED chip.

The two-phase-flow heat transfer device may be a sintered composite heat pipe with grooves, and the heat pipe is provided with a flat portion as the mounting plane on the side thereof.

The beneficial effects of the present invention could include:

In the present invention the two-phase-flow heat transfer device is used, through the outstanding heat exchange performance of the two-phase-flow heat transfer device, the heat generated by LED chip at work could be conducted through the two-phase-flow heat transfer device to the outside of the LED packaging structure, hereby achieving better working effects and longer lifespans. The present invention exploits an Fresnel lens as the light emitting window, to refract the light generated by the LED chip disposed inside the metal housing, so as to realize the effects of light focusing and luminescent efficiency enhancing; and as the Fresnel lens is flat-plate-shaped, while assembled with the metal housing, it occupies little space, making the whole assembly more easy, and allowing the LED chip inside the metal housing to be disposed more closely to the open, the light source is thus fully exploited and the heat generated by the LED chip will not impact the lens, hereby ensuring the working performance of the product with a longer service life. The two-phase-flow heat transfer device used in the present invention could be a heat pipe, heat column or vapor chamber, which all work based on the principle of heat conduction by medium in a vacuum environment. A variety of shapes, or extra cooling fins could help increase the heat dissipation area for better heat dissipation effects. In an LED according to the present invention heat could be discharged quickly, thus the device could handle longer continuously working time, and have a longer service life.

BRIEF DESCRIPTION OF DRAWINGS

The present invention will be further illustrated by way of embodiments in association with the accompanying drawings.

DETAILED DESCRIPTION OF THE EMBODIMENTS

As shown by FIGS. 1 to 5 and 9, the LED packaging structure according to the present invention comprises:

a metal housing 2, having a cavity 21 and two open ends, the cavity 21 is used for containing the internal components, such as an LED chip 1, which are disposed into the cavity 21 through the bottom of the metal housing 2;

a lens 3 mounted in the first open end of the metal housing 2, the lens 3 is used for focusing the light rays emitted by the LED chip 1, to provide better illumination;

a sintered two-phase-flow heat transfer device 4 with a flat top mounting plane 41 thereon, which is connected to the second open end of the metal housing 2, the sintered two-phase-flow heat transfer device 4 adopted by the present invention is a flow system filled with a two-phase substance, which may be the vapor-liquid, liquid-solid or vapor-solid two-phase-change substances. For example, typically the device adopted by the present invention comprises a highly vacuum confined space allowing the media therein to change its phases easily; a small amount of working fluid is filled in the confined space, such as water, ethanol, ammonia, or other mixtures, as the media for two-phase-change heat transfer. The confined space further has a capillary structure on the inner wall thereof, for transporting the media in its fluid phase. While working, the two-phase-flow heat transfer device transfers the head absorbed from one end to another end quickly. In the preferred embodiments of the present invention the sintered two-phase-flow heat transfer device may be a typical heat column, heat pipe or vapor chamber;

at least one LED chip 1 disposed in the cavity 21 of the metal housing 2, and on the mounting plane 41 of the sintered two-phase-flow heat transfer device 4, the LED chip 1 may be welded on the mounting plane 41, wherein an insulation layer (not shown in the accompanying drawings) is disposed between the LED and the mounting plane 41 for preventing electrical connection between them;

at least one electrical connection device 5 connecting at least one LED chip 1 to an external circuit, the electrical connection device 5 may be the common metal wires or pieces;

a fixing base 6 for fixing the two-phase-flow heat transfer device 4, electrical connection device 5 and LED chip 1 together.

Figure 6:
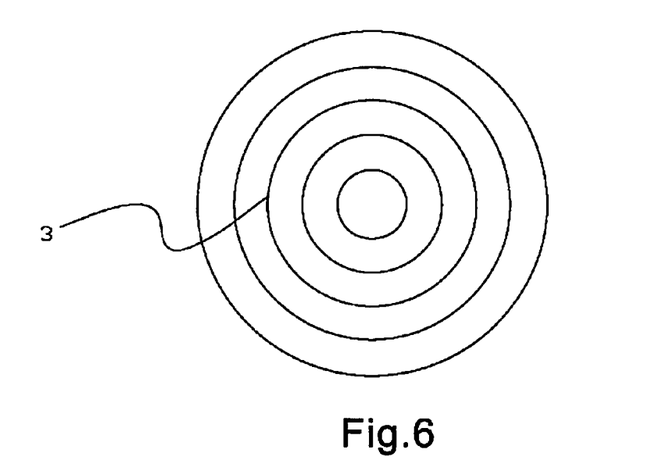
FIG. 6 is a schematic view of the Fresnel lens used in the preferred embodiments of the present invention.
Figure 7:
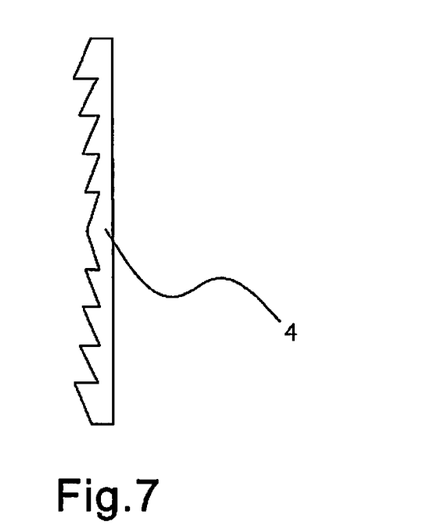
FIG. 7 is a side sectional view of the Fresnel lens used in the preferred embodiments of the present invention.
Figure 8:
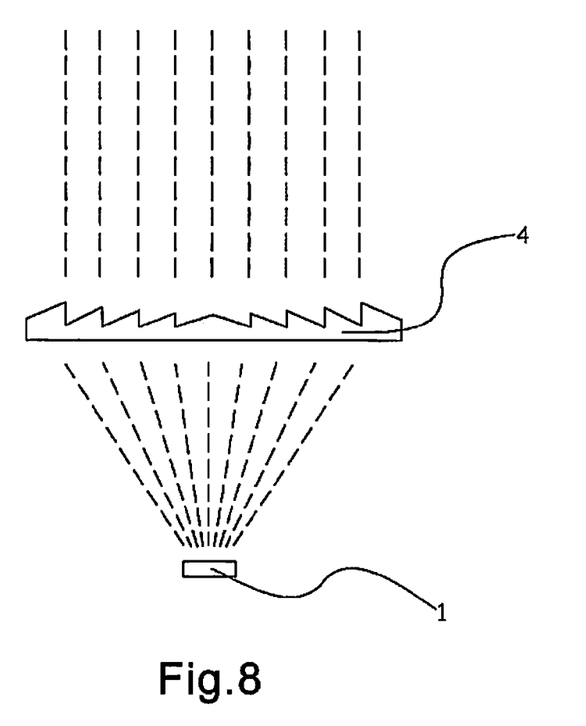
FIG. 8 is a schematic view of the optical path of the Fresnel lens.
Figure 9:
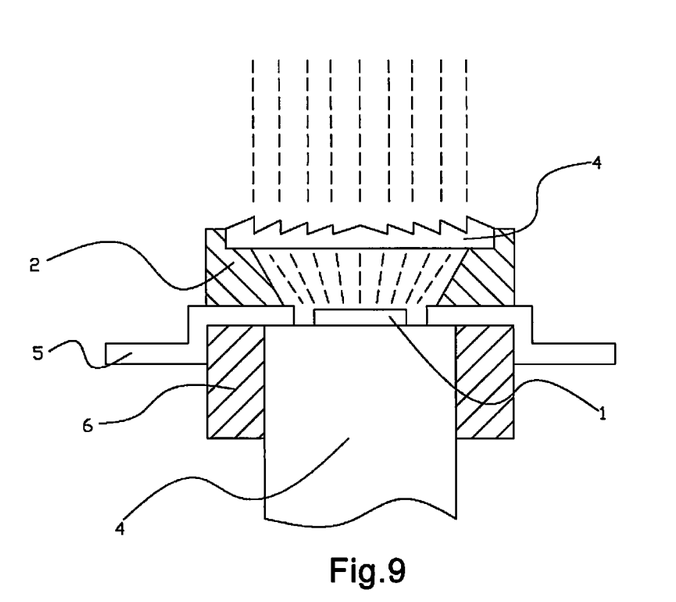
FIG. 9 is schematic view of the present invention in use.

The lens 3 and metal housing 2 in the present invention could be the common types in the industry, but as a preferred embodiment, the lens 3 is a Fresnel lens, of which structure is shown in FIGS. 6 and 7. An a Fresnel lens has a plane on one side thereof, and a plurality of different concentric circularity lines in size on the other side thereof, its lines are designed depending on the interference and refraction of the light and according to the requirements of relative sensibility and receiving angle, to focus the light bundle so as to provide better light concentration effects and improve the luminescent efficiency. In addition to above, the Fresnel lens 3 also has the advantage of simple structure, small size, and saving space and materials. FIG. 8 illustrates the effect of the light generated by a point light source 7 and refracted by the Fresnel lens 3, from the figure it is observed that after refracted by the Fresnel lens 3, the light generated by the point light source, for example the LED chip 1 in the present invention, could be more even and concentrative. In contrast, after refracted by the Fresnel lens 3, the parallel light rays would be more concentrative. Resulting from above, the use of the Fresnel lens 3 in the present invention could give extra performance. In addition, as the Fresnel lens 3 is flat-plate-shaped, only little space is occupied while it is assembled in the metal housing 2, thus the assembly is more convenient, allowing the LED chip inside the metal housing to be disposed more closely to the open, the light rays are thus fully exploited and the heat generated by the LED chip will not impact the lens, hereby ensuring the working performance of the product with a longer service life. FIG. 9 shows an LED according to the present invention at work. In an actual implementation of the LED packaging structure disclosed by the present invention, the back side of the lens 3 must be coated with phosphor (not shown in the accompanying drawings), and lens 3 and the LED chip 1 must be packaged face to face.

In addition to above, as a preferred embodiment, the inner surface of the cavity 21 of the metal housing 2 is smooth, and the cavity 21 is bowl or taper shaped to refract the light rays from the point light source of the LED chip 1 to the lens 3, the light is further focused by the lens 3, whereby the luminescent efficiency is enhanced to make the entire design achieve the best performance.

Figure 1:
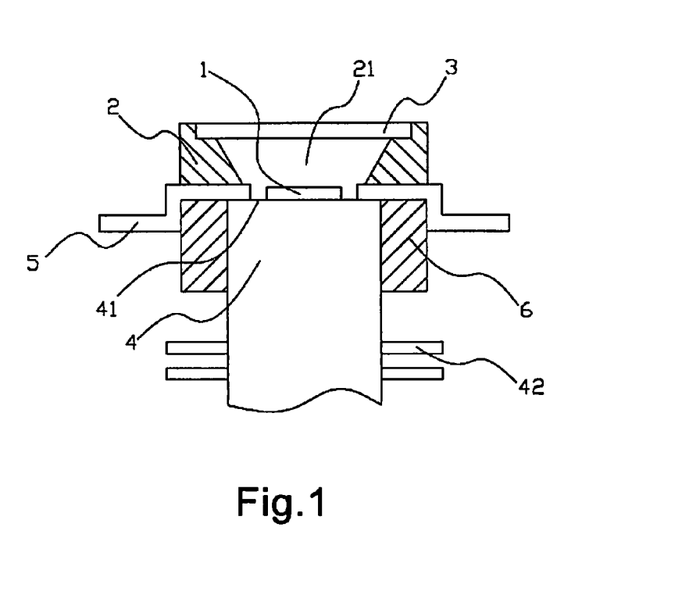
FIG. 1 is a schematic view of the first embodiment of the LED packaging structure according to the present invention.

As describe previously, the sintered two-phase-flow heat transfer device 4 in the present invention has a highly vacuum confined space, a capillary structure sintered on the inner wall of the confined space, and a working fluid filled in the confined space, the followings are some embodiments of the two-phase-flow heat transfer device 4 as references:

As shown by FIG. 1, in the first embodiment of the present invention the two-phase-flow heat transfer device 4 is a heat column, the fixing base 6 is fixed under the metal housing 2, the two-phase-flow heat transfer device 4 is disposed in the middle of the fixing base 6 and extends downwards and out of the fixing base 6 to form a heat dissipation portion, the interior of the heat column is vacuumed and filled with a capillary structure and working fluid for heat conduction, the upper end of the heat column is used as the mounting plane 41 for mounting the LED chip 1, and a plurality of cooling fins 42 are located on the side away from the mounting plane 41 to increase the total heat dissipation area for better heat dissipation effects.

Figure 2:
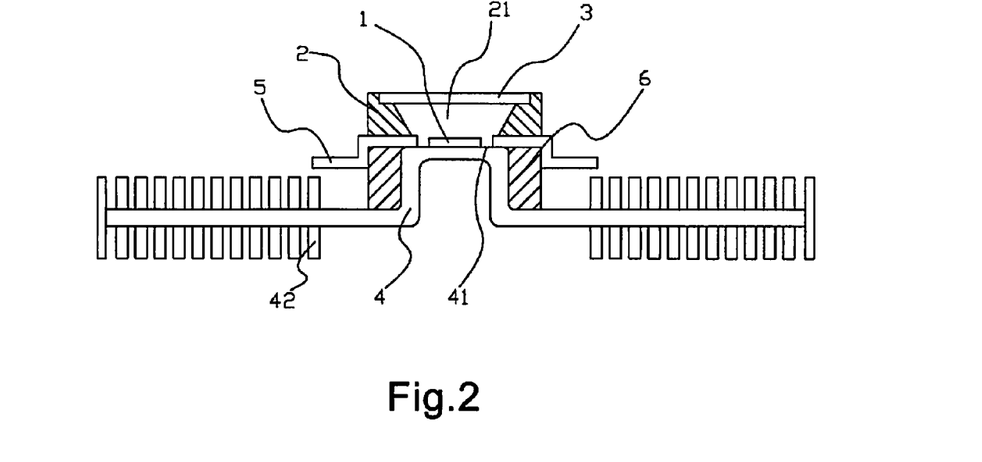
FIG. 2 is a schematic view of the second embodiment of the LED packaging structure according to the present invention.

FIG. 2 illustrates the second embodiment of the present invention, wherein the two-phase-flow heat transfer device 4 is a bended or flattened heat pipe, having a two-phase-flow heat conduction structure therein, and the mounting plane 41 is located in the middle of the heat pipe, thus the two ends of the heat pipe could be used as the heat dissipation portion, the fixing base 6 is disposed under the metal housing 2, while the two-phase-flow heat transfer device 4 is disposed above the metal housing 2, and extends laterally and beyond the two ends of the metal housing to form two heat dissipation portions, the heat generated by the LED chip mounted in the middle of the heat pipe could be conducted by the heat dissipation portions on the two sides respectively, the heat exchange efficiency is thus improved. Furthermore, the two-phase-flow heat transfer device 4 could be provided with a plurality of cooling fins on both sides thereof, to enlarge the heat dissipation area so as to further enhance the heat dissipation performance.

Figure 3:
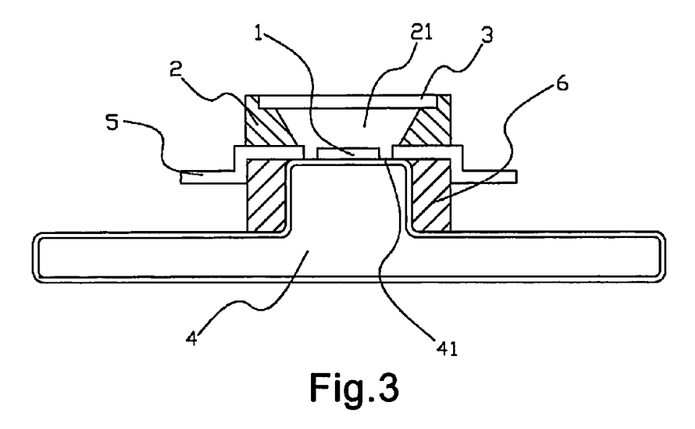
FIG. 3 is a schematic view of the third embodiment of the LED packaging structure according to the present invention.

The third embodiment of the present invention is shown by FIG. 3, wherein the two-phase-flow heat transfer device 4 is a vapor chamber having at least one projecting plane, the interior of the vapor chamber is vacuumed and filled with working fluid, the projecting plane is used as the mounting plane 41 for mounting the LED chip 1, the fixing base 6 is fixed above the vapor chamber and the mounting plane 6 is disposed within the fixing base 6; as the vapor chamber already has a large heat dissipation area, no extra heat sink is required herein.

Figure 4:
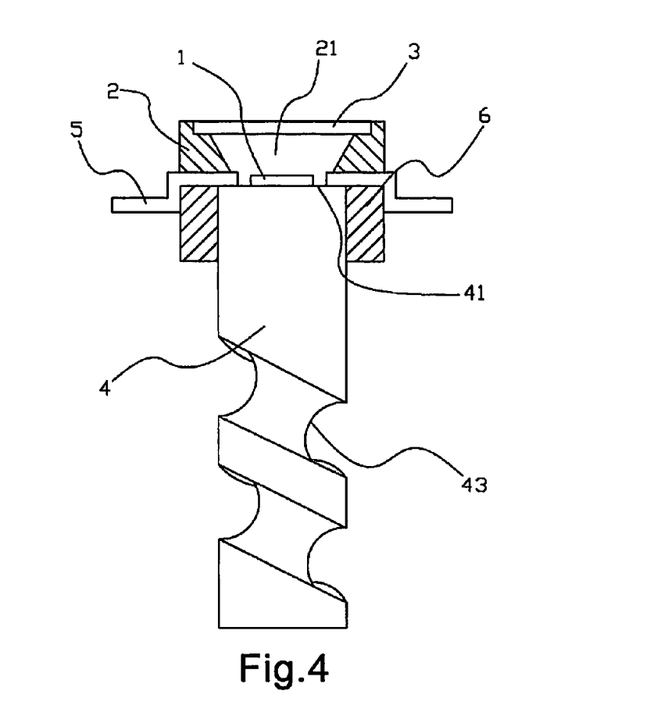
FIG. 4 is a schematic view of the fourth embodiment of the LED packaging structure according to the present invention.
Figure 5:
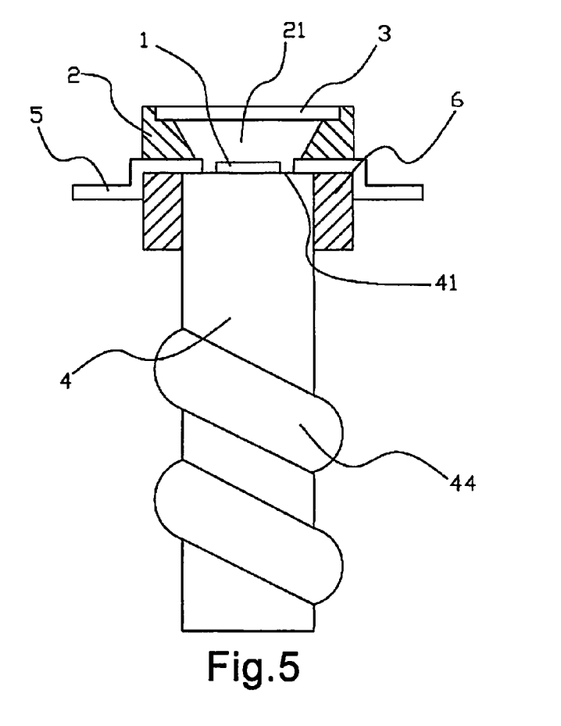
FIG. 5 is an exploded view of the fourth embodiment of the LED packaging structure according to the present invention.

As shown by FIG. 4, in the fourth embodiment of the present invention the sintered two-phase-flow heat transfer device 4 is a heat pipe, of which interior could be a typical two-phase-flow heat conduction structure. The electronic components could be mounted on the upper part of the fixing base 6, and the two-phase-flow heat transfer device 4 extends outwards through the fixing base 6, the flat upper end of the two-phase-flow heat transfer device 4 is used as the mounting plane 41 for mounting the LED chip 1; in addition, in order to enhance the heat dissipation performance, the heat pipe is provided with an external spiral groove 43, for accommodating an extra heat pipe 44 of which shape is matched with the spiral groove 43, in other words the two heat pipes are fixed with each other in a twisted manner, a product assembled with an extra heat pipe 44 is shown in FIG. 5; wherein, as shown in FIG. 10, the extra heat pipe 44 is provided with grooves 441 and a copper powder sintering portion 442 on the inner wall thereof, wherein the diameters of the majority of the copper powders of the copper powder sintering portion 442 are greater than the width of the grooves 441, in general the smaller the width of the grooves is, the stronger the capillary force and other tensile forces are, resulting in quick heat dissipation and fast backflow from lower temperature end.

Figure 10:
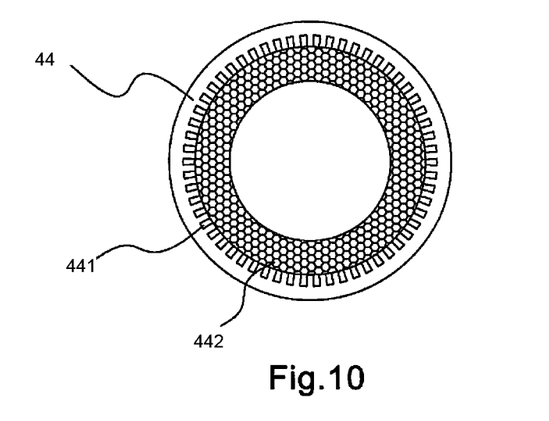
FIG. 10 is a cross-sectional view of an extra heat pipe.
Figure 11:
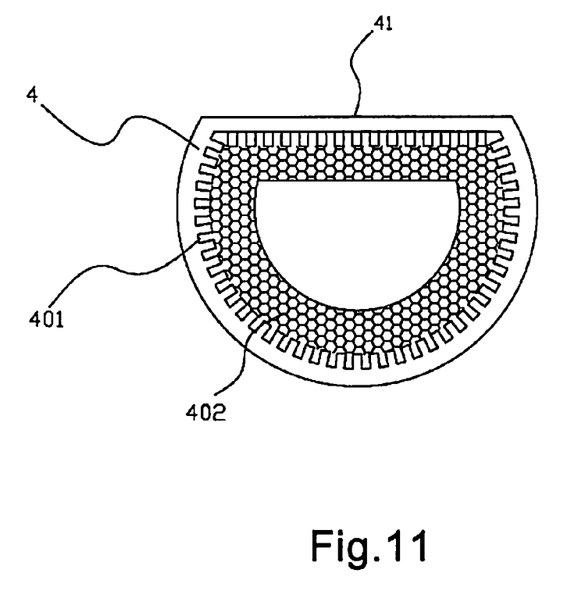
FIG. 11 is a sectional view of a two-phase-flow heat transfer device across its flat portion in an embodiment.

Of course, in addition to abovementioned embodiments, the two-phase-flow heat transfer device 4 of the present invention could have other variants, for example, it may be a sintered composite heat pipe with grooves, the heat pipe is provided with a flat portion as the mounting plane 41 on the side thereof, FIG. 11 is a sectional view of the heat pipe across the flat portion, the heat pipe is provided with grooves 401 and a sintered capillary structure 402, and the outside flat portion could be formed by the direct pressing process on the heat pipe; the other portions of the heat pipe could be in their original circular shapes or other shapes as shown in FIG. 10, for the purpose of connecting the external heat dissipation device to fast transfer and dissipate the heat generated by the LED.

In addition, in practice for conveniences in electricity connecting, the electrical connection device 5 can be designed in a Z-shape, of which tail goes across the fixing base 6, forming two external poles to connect the LED chip to an external power source.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structure.

The invention claimed is:

1. An LED packaging structure, comprising:
   a metal housing, having a cavity and two open ends, the cavity of the metal housing being bowl or taper shaped and provided with a smooth surface;
   a lens, disposed in the first open end of the metal housing;
   a sintered heat pipe, having a flat top mounting plane, and connected to the second open end of the metal housing;
   at least one LED chip, having a wavelength is between 310 to 470 nm, disposed in the cavity of the metal housing and said at least one LED chip is mounted on the flat to mounting plane of the sintered heat pipe;
   an electrical connection device, to connect the LED chip to an external circuit;
   a fixing base, to fix the sintered heat pipe, the electrical connection device and the LED chip together;
   wherein,
   the lens is a Fresnel lens consisting of a plurality of homocentric structures;
   the sintered heat pipe is provided with an external spiral groove for accommodating an extra heat pipe in a twisted manner, and
   wherein an inner wall of the extra heat pipe is provided with grooves and a copper powder sintering portion and diameters of a majority of the copper powders of the copper powder sintering portion are greater than a width of the grooves.

2. The LED packaging structure according to claim 1, wherein a tail of the electrical connection device extends through the fixing base to form external electrodes; the LED chip is selected from one of an ultra violet LED, purple LED, and blue LED; and the lens is coated by phosphor.

\* \* \* \* \*